(12) United States Patent
Zhao et al.

(10) Patent No.: US 10,109,648 B2
(45) Date of Patent: Oct. 23, 2018

(54) SEMICONDUCTOR LAYER STRUCTURE

(71) Applicant: Wuhan China Star Optoelectronics Technology Co., Ltd., Wuhan, Hubei (CN)

(72) Inventors: Yu Zhao, Guangdong (CN); Zhandong Zhang, Guangdong (CN)

(73) Assignee: Wuhan China Star Optoelectonics Technology Co., Ltd, Wuhan, Hubei (CN)

( * ) Notice: Subject to any disclaimer, the term of this patent is extended or adjusted under 35 U.S.C. 154(b) by 230 days.

(21) Appl. No.: 14/915,225

(22) PCT Filed: Jan. 22, 2016

(86) PCT No.: PCT/CN2016/071710
§ 371 (c)(1),
(2) Date: Feb. 27, 2016

(87) PCT Pub. No.: WO2017/113451
PCT Pub. Date: Jul. 6, 2017

(65) Prior Publication Data
US 2018/0047757 A1     Feb. 15, 2018

(30) Foreign Application Priority Data
Dec. 28, 2015 (CN) .......................... 2015 1 1002931

(51) Int. Cl.
*H01L 27/12* (2006.01)
*H01L 29/78* (2006.01)
(Continued)

(52) U.S. Cl.
CPC ........ *H01L 27/1222* (2013.01); *G02F 1/1368* (2013.01); *H01L 27/127* (2013.01); *H01L 29/78603* (2013.01); *H01L 29/78696* (2013.01)

(58) Field of Classification Search
CPC .............. H01L 27/1222; H01L 27/127; H01L 29/78603; H01L 29/78696; G02F 1/1368
See application file for complete search history.

(56) References Cited

U.S. PATENT DOCUMENTS 8,203,216 B2 * 6/2012 Sasaki ..................... H01L 24/05
257/777
8,502,242 B2 * 8/2013 Kim .................... H01L 25/0756
257/103
(Continued)

FOREIGN PATENT DOCUMENTS

CN         102201442 A      9/2011
CN         102332469 A      1/2012
(Continued)

*Primary Examiner* — Ida M Soward
(74) *Attorney, Agent, or Firm* — Andrew C. Cheng

(57) ABSTRACT

The present disclosure a semiconductor layer structure having an insulating substrate and a semiconductor layer formed on the insulating substrate. The semiconductor layer includes a source signal access terminal, a drain signal access terminal, a first semiconductor layer pattern and a second semiconductor layer pattern; the first semiconductor layer pattern and the second semiconductor layer pattern formed between the source signal access terminal and the drain signal access terminal in parallel. The present disclosure also provides a method for fabricating a semiconductor layer structure.

5 Claims, 2 Drawing Sheets

(51) Int. Cl.
*G02F 1/13* (2006.01)
*H01L 29/786* (2006.01)
*G02F 1/1368* (2006.01)

(56) References Cited

U.S. PATENT DOCUMENTS

| | | | | |
|---|---|---|---|---|
| 8,637,913 | B2* | 1/2014 | Yoo | H01L 29/66833 |
| | | | | 257/314 |
| 8,791,524 | B2* | 7/2014 | Ichinose | H01L 27/11582 |
| | | | | 257/319 |
| 9,362,304 | B2* | 6/2016 | Kim | H01L 29/792 |
| 9,818,737 | B2* | 11/2017 | Lee | H01L 27/0207 |
| 2011/0018051 | A1* | 1/2011 | Kim | H01L 27/11575 |
| | | | | 257/324 |
| 2012/0097963 | A1 | 4/2012 | Kokubo | |
| 2014/0015032 | A1* | 1/2014 | Kim | H01L 27/11575 |
| | | | | 257/324 |
| 2014/0166063 | A1* | 6/2014 | Jang | H01L 35/32 |
| | | | | 136/205 |
| 2015/0369522 | A1* | 12/2015 | Grunwald | H01L 35/04 |
| | | | | 62/3.2 |
| 2016/0233282 | A1* | 8/2016 | Song | H01L 51/56 |

FOREIGN PATENT DOCUMENTS

| | | |
|---|---|---|
| CN | 103681792 A | 3/2014 |
| CN | 103872121 A | 6/2014 |

* cited by examiner

SEMICONDUCTOR LAYER STRUCTURE

FIELD OF THE INVENTION

The present invention relates to a display field, especially to a semiconductor layer structure in a thin film transistor, and a method for fabricating the semiconductor layer structure.

BACKGROUND OF THE INVENTION

In the present time, the thin film transistor liquid crystal display (TFT-LCD) is developed to have high pixel per inch (ppi). One big obstacle for developing high ppi is the charging speed of the TFT. The production art for the TFT is to form a traditional metal oxide semiconductor layer structure. The mobility of electrons in the amorphous silicon is 0.5 to 1.0, and the mobility of electrons in the polysilicon is 30 to 300. Moreover, the production art is also a cause to decrease the mobility of the electrons. Therefore, designing a semiconductor layer structure and a TFT with reduced electric resistance to raise charging speed becomes an urgent problem.

SUMMARY OF THE INVENTION

To solve aforementioned technical problem, the present invention provides a semiconductor layer structure comprising an insulating substrate and a semiconductor layer comprising a source signal access terminal, a drain signal access terminal, a first semiconductor layer pattern and a second semiconductor layer pattern. The first semiconductor layer pattern and the second semiconductor layer pattern are formed between the source signal access terminal and the drain signal access terminal in parallel.

Further, the semiconductor layer structure further comprises a buffering layer formed between the semiconductor layer and the insulating substrate.

Further, the first semiconductor layer pattern and the second semiconductor layer pattern are formed as "n"-shaped and are formed across the source signal access terminal and the drain signal access terminal.

Further, the first semiconductor layer pattern comprises two first bodies and a first connecting part connecting to the two first bodies; two ends of one of the first bodies respectively connect to the source signal access terminal and the first connecting part; two ends of the other one of the first bodies respectively connect to the drain signal access terminal and the first connecting part; the second semiconductor layer pattern comprises two second bodies and a second connecting part connecting to the two second bodies; two ends of one of the second bodies respectively connect to the source signal access terminal and the second connecting part; two ends of the other one of the second bodies respectively connect to the drain signal access terminal and the second connecting part.

Further, the two first bodies are parallel to the two second bodies, and the first connecting part is parallel to the second connecting part.

Further, the insulating substrate is a glass substrate.

A TFT comprises an aforementioned semiconductor layer structure.

A method for fabricating a semiconductor layer structure comprising steps of: providing an insulating substrate; and forming a semiconductor layer on the insulating substrate, wherein the semiconductor layer comprises a source signal access terminal, a drain signal access terminal, a first semiconductor layer pattern and a second semiconductor layer pattern, and the first semiconductor layer pattern and the second semiconductor layer pattern are formed between the source signal access terminal and the drain signal access terminal in parallel.

A method for fabricating a semiconductor layer structure comprising steps of: providing an insulating substrate; forming a buffering layer on the insulating substrate; forming a semiconductor layer on the buffering layer, wherein the semiconductor layer comprises a source signal access terminal, a drain signal access terminal, a first semiconductor layer pattern and a second semiconductor layer pattern, and the first semiconductor layer pattern and the second semiconductor layer pattern are formed between the source signal access terminal and the drain signal access terminal in parallel.

Further, the first semiconductor layer pattern comprises two first bodies and a first connecting part connecting to the two first bodies; two ends of one of the first bodies respectively connect to the source signal access terminal and the first connecting part; two ends of the other one of the first bodies respectively connect to the drain signal access terminal and the first connecting part; the second semiconductor layer pattern comprises two second bodies and a second connecting part connecting to the two second bodies; two ends of one of the second bodies respectively connect to the source signal access terminal and the second connecting part; two ends of the other one of the second bodies respectively connect to the drain signal access terminal and the second connecting part.

The semiconductor layer structure, the TFT and the method for fabricating the semiconductor layer structure provided by the present invention with the first semiconductor layer pattern and the second semiconductor layer pattern formed in parallel can reduce the electric resistance and also increase the charging speed of the TFT with the semiconductor layer structure. On the other hand, when the first semiconductor layer pattern has defects so that the pixel is abnormal, the defective first semiconductor layer pattern can be cut off and then the second semiconductor layer pattern can still maintain the electric conduction of the channel to make sure that the semiconductor layer structure operates normally.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF THE PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

First Embodiment

Figure 1:
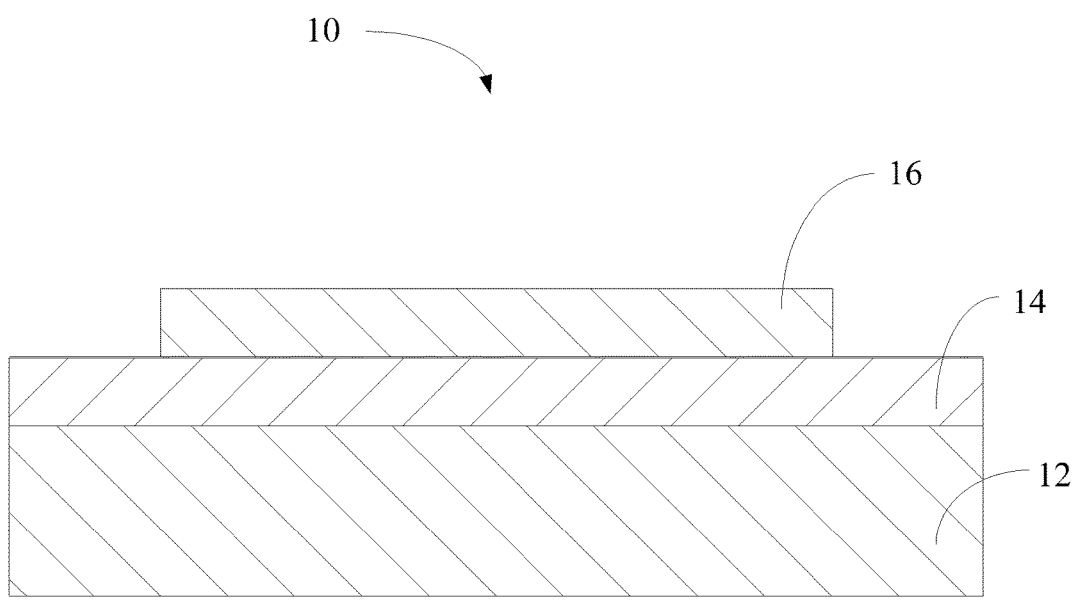
FIG. 1 is an illustrative view in cross section of an embodiment of a semiconductor layer structure provided by the present invention.

With reference to FIG. 1, a semiconductor layer structure 10 is an essential part of the TFT. The semiconductor layer structure 10 comprises an insulating substrate 12, a buffering layer 14 and a semiconductor layer 16. The insulating substrate 12 may be a glass substrate. The buffering layer 14 and the semiconductor layer 16 are attached to the insulating substrate 12 in sequence, and the buffering layer 14 is located between the semiconductor layer 16 and the insulating substrate 12. In other word, the semiconductor layer 16 and the insulating substrate 12 are attached respectively to two sides of the buffering layer 14.

Figure 2:
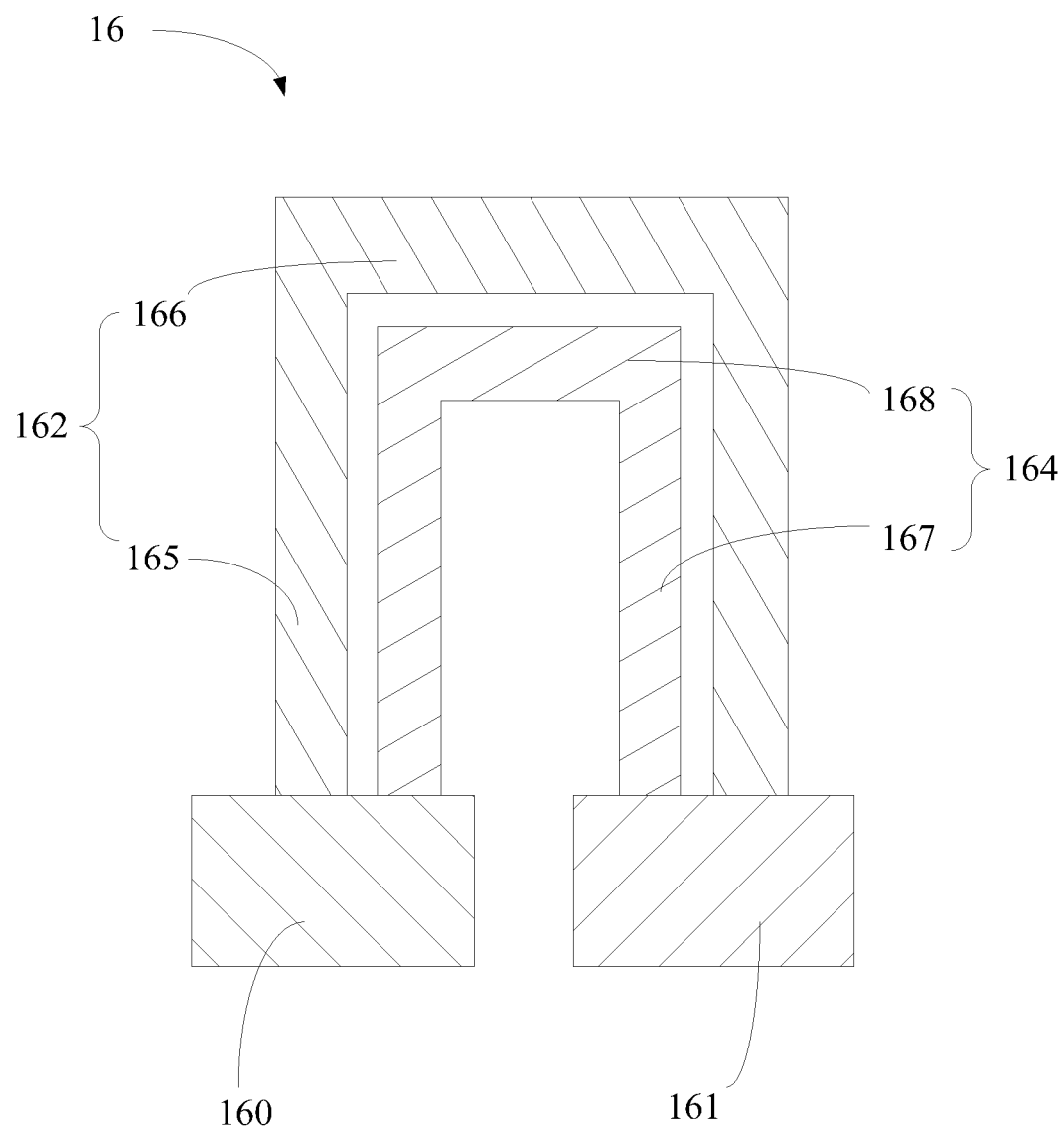
FIG. 2 is an illustrative view in cross section of a semiconductor layer of the semiconductor layer structure in FIG. 1.

With reference to FIG. 2, the semiconductor layer 16 comprises a source signal access terminal 160, a drain signal access terminal 161, a first semiconductor layer pattern 162 and a second semiconductor layer pattern 164. The source signal access terminal 160 and the drain signal access terminal 161 are formed on the buffering layer 14 in intervals. The first semiconductor layer pattern 162 and the second semiconductor layer pattern 164 are formed as "n"-shaped and are formed across the source signal access terminal 160 and the drain signal access terminal 161. Specifically, the first semiconductor layer pattern 162 comprises two first bodies 165 and a first connecting part 166 connecting to the two first bodies 165. Two ends of one of the first bodies 165 respectively connect to the source signal access terminal 160 and the first connecting part 166. Two ends of the other one of the first bodies 165 respectively connect to the drain signal access terminal 161 and the first connecting part 166. The second semiconductor layer pattern 164 comprises two second bodies 167 and a second connecting part 168 connecting to the two second bodies 167. Two ends of one of the second bodies 167 respectively connect to the source signal access terminal 160 and the second connecting part 168. Two ends of the other one of the second bodies 167 respectively connect to the drain signal access terminal 161 and the second connecting part 168. In this embodiment, the two first bodies 165 and the two second bodies 167 are parallel to each other. The first connecting part 166 and the second connecting part 168 are parallel to each other. The second semiconductor pattern 164 is contained in the first semiconductor pattern 162.

The semiconductor layer structure 10 with the first semiconductor layer pattern 162 and the second semiconductor layer pattern 164 formed in parallel can reduce the electric resistance and also increase the charging speed of the TFT with the semiconductor layer structure 10. On the other hand, when the first semiconductor layer pattern has defects so that the pixel is abnormal, the defective first semiconductor layer pattern 162 can be cut off and then the second semiconductor layer pattern 164 can still maintain the electric conduction of the channel.

It can be understand that, in other embodiment, the buffering layer 14 may be deleted. The first semiconductor layer pattern 162 and the second semiconductor layer pattern 164 are not limited to the "n"-shaped as shown in this embodiment, but may be a wave-shaped, spiral, inverted V-shaped and any other random shapes, which only need to meet for the first semiconductor layer pattern 162 and the second semiconductor layer pattern 164 without intersection and to electrically connect to the source signal access terminal 160 and the drain signal access terminal 161.

Second Embodiment

With reference to FIGS. 1 and 2, an embodiment of a method for fabricating a semiconductor layer structure in accordance with the present invention comprises following steps:

An insulating substrate 12 is provided, and the insulating substrate 12 may be a glass substrate.

A buffering layer 14 is formed on the insulating substrate 12.

A semiconductor layer 16 is formed on the buffering layer 14. Specifically, the semiconductor layer 16 comprises a source signal access terminal 160, a drain signal access terminal 161, a first semiconductor layer pattern 162 and a second semiconductor layer pattern 164. The source signal access terminal 160 and the drain signal access terminal 161 are formed on the buffering layer 14 in intervals. The first semiconductor layer pattern 162 and the second semiconductor layer pattern 164 are formed as "n"-shaped and are formed across the source signal access terminal 160 and the drain signal access terminal 161. Specifically, the first semiconductor layer pattern 162 comprises two first bodies 165 and a first connecting part 166 connecting to the two first bodies 165. Two ends of one of the first bodies 165 respectively connect to the source signal access terminal 160 and the first connecting part 166. Two ends of the other one of the first bodies 165 respectively connect to the drain signal access terminal 161 and the first connecting part 166. The second semiconductor layer pattern 164 comprises two second bodies 167 and a second connecting part 168 connecting to the two second bodies 167. Two ends of one of the second bodies 167 respectively connect to the source signal access terminal 160 and the second connecting part 168. Two ends of the other one of the second bodies 167 respectively connect to the drain signal access terminal 161 and the second connecting part 168. In this embodiment, the two first bodies 165 and the two second bodies 167 are parallel to each other. The first connecting part 166 and the second connecting part 168 are parallel to each other. The second semiconductor pattern 164 is contained in the first semiconductor pattern 162.

The semiconductor layer structure 10 fabricated by the method for fabricating the semiconductor layer structure with the first semiconductor layer pattern 162 and the second semiconductor layer pattern 164 formed in parallel can reduce the electric resistance and also increase the charging speed of the TFT with the semiconductor layer structure 10. On the other hand, when the first semiconductor layer pattern has defects so that the pixel is abnormal, the defective first semiconductor layer pattern 162 can be cut off and then the second semiconductor layer pattern 164 can still maintain the electric conduction of the channel.

It can be understand that, in other embodiment, the step to form the buffering layer 14 on the insulating substrate 12 may be deleted. The first semiconductor layer pattern 162 and the second semiconductor layer pattern 164 are not limited to the "n"-shaped as shown in this embodiment, but may be a wave-shaped, spiral, inverted V-shaped and any other random shapes, which only need to meet for the first semiconductor layer pattern 162 and the second semiconductor layer pattern 164 without intersection and to electrically connect to the source signal access terminal 160 and the drain signal access terminal 161.

Above are embodiments of the present invention, which does not limit the scope of the present invention. Any modifications, equivalent replacements or improvements within the spirit and principles of the embodiment described above should be covered by the protected scope of the invention.

What is claimed is:

1. A semiconductor layer structure comprising:
an insulating substrate;
a semiconductor layer formed on the insulating substrate comprising a source signal access terminal, a drain signal access terminal, a first semiconductor layer pattern and a second semiconductor layer pattern; the first semiconductor layer pattern and the second semiconductor layer pattern formed between the source signal access terminal and the drain signal access terminal in parallel; and
wherein the first semiconductor layer pattern comprises two first bodies and a first connecting part connecting to the two first bodies; two ends of one of the first bodies respectively connect to the source signal access terminal and the first connecting part; two ends of the other one of the first bodies respectively connect to the drain signal access terminal and the first connecting part; the second semiconductor layer pattern comprises two second bodies and a second connecting part connecting to the two second bodies; two ends of one of the second bodies respectively connect to the source signal access terminal and the second connecting part; two ends of the other one of the second bodies respectively connect to the drain signal access terminal and the second connecting part.

2. The semiconductor layer structure according to claim 1, wherein the semiconductor layer structure further comprises a buffering layer formed between the semiconductor layer and the insulating substrate.

3. The semiconductor layer structure according to claim 1, wherein the first semiconductor layer pattern and the second semiconductor layer pattern are formed as "n"-shaped and are formed across the source signal access terminal and the drain signal access terminal.

4. The semiconductor layer structure according to claim 1, wherein the two first bodies are parallel to the two second bodies, and the first connecting part is parallel to the second connecting part.

5. The semiconductor layer structure according to claim 1, wherein the insulating substrate is a glass substrate.

* * * * *